United States Patent
Fisher et al.

(10) Patent No.: US 9,625,509 B1
(45) Date of Patent: Apr. 18, 2017

(54) AUTOMATED SENSOR SYSTEM FOR RF SHIELDING CHARACTERIZATION

(71) Applicants: Patrick Joel Fisher, Pittsburgh, PA (US); Walter John Keller, III, Bridgeville, PA (US)

(72) Inventors: Patrick Joel Fisher, Pittsburgh, PA (US); Walter John Keller, III, Bridgeville, PA (US)

(73) Assignee: NOKOMIS, INC., Charleroi, PA (US)

( * ) Notice: Subject to any disclaimer, the term of this patent is extended or adjusted under 35 U.S.C. 154(b) by 506 days.

(21) Appl. No.: 14/199,166

(22) Filed: Mar. 6, 2014

Related U.S. Application Data

(60) Provisional application No. 61/851,325, filed on Mar. 6, 2013.

(51) Int. Cl.
 *G01R 27/28* (2006.01)
 *G01R 29/08* (2006.01)

(52) U.S. Cl.
 CPC .......... *G01R 29/0835* (2013.01); *G01R 27/28* (2013.01)

(58) Field of Classification Search
 CPC ........ G01N 22/00; G01R 27/28; G01R 27/00; G01R 27/04; G01R 27/32; G01R 27/06;
 (Continued)

(56) References Cited

U.S. PATENT DOCUMENTS 3,492,568 A * 1/1970 Johnson ................. G01R 29/00
 174/377

5,218,294 A 6/1993 Soiferman
 (Continued)

FOREIGN PATENT DOCUMENTS

CN 101662078 B * 8/2012

OTHER PUBLICATIONS

Parker Seals, Shielding Effectiveness Test Method for Commerical Style EMI Gaskets, Revision A, Apr. 1993.*
 (Continued)

*Primary Examiner* — Patrick Assouad
*Assistant Examiner* — Sean Curtis
(74) *Attorney, Agent, or Firm* — James Ray and Assoc. LLC

(57) ABSTRACT

A system for determining structural characteristics of an electromagnetic energy shielding material during a manufacturing process includes a transmitting antenna device mounted for a reciprocal linear movement across a width thereof, the transmitting antenna device being connected to a source of the electromagnetic energy and operable to transmit waves of the electromagnetic energy through the thickness of the electromagnetic energy shielding material during the reciprocal linear movement. A receiving antenna device is also mounted for the reciprocal linear movement in an alignment with the transmitting antenna device and operable to receive, during the reciprocal linear movement, the waves of electromagnetic energy being absorbed and attenuated by the electromagnetic energy shielding material. Power actuators are also provided to move the transmitting and the receiving antenna devices while the electromagnetic energy shielding material is moving in a linear direction being transverse to the reciprocal linear movement.

26 Claims, 3 Drawing Sheets

(58) Field of Classification Search
CPC .... G01R 27/26; G01R 27/2605; G01R 31/11; G01R 31/261; G01R 31/2623; G01R 31/002; G01R 31/31924; G01R 31/2874; G01R 31/2875; G01R 15/12; G01R 15/144; G01R 19/00; G01R 19/30; G01R 19/04; G01R 19/2506; G01R 21/06; G01R 1/28; G01R 13/00; G01R 13/0272; G01R 13/34; G01R 13/345; G01R 23/16; G06F 3/044; G01D 5/2405; G01V 3/083; G01V 3/088; G01V 3/12; G01V 3/265; G01V 3/30; G01V 3/28; G01V 3/081; G01V 3/10; G01V 2003/084; G06K 19/07336; G02B 6/12009; G02F 1/2955
USPC ....... 324/627, 612, 600, 629, 637, 649, 658, 324/663, 671, 500, 537, 750.01, 7, 50.12, 324/76.11, 76.12, 95, 144, 337, 334, 332; 349/59; 361/816
See application file for complete search history.

(56) References Cited

U.S. PATENT DOCUMENTS

| | | | |
|---|---|---|---|
| 5,227,800 A | 7/1993 | Huguenin et al. | |
| 5,302,830 A | 4/1994 | Shivanandan | |
| 5,393,557 A * | 2/1995 | Darling, Jr. | C23C 16/52 427/10 |
| 5,424,633 A | 6/1995 | Soiferman | |
| 5,517,110 A | 5/1996 | Soiferman | |
| 5,563,809 A * | 10/1996 | Williams | G01N 9/24 700/122 |
| 5,668,342 A | 9/1997 | Discher | |
| 5,714,888 A | 2/1998 | Naujoks | |
| 5,828,220 A * | 10/1998 | Carney | H05K 9/0069 174/350 |
| 6,049,301 A | 4/2000 | Weagant | |
| 6,057,765 A | 5/2000 | Jones et al. | |
| 6,163,259 A | 12/2000 | Barsumian et al. | |
| 6,255,830 B1 * | 7/2001 | Rollin | H05K 9/0069 174/387 |
| 6,492,957 B2 * | 12/2002 | Carillo, Jr. | H01Q 1/245 250/336.1 |
| 6,496,703 B1 | 12/2002 | da Silva | |
| 6,720,905 B2 | 4/2004 | Levitan et al. | |
| 6,759,863 B2 | 7/2004 | Moore | |
| 6,765,527 B2 | 7/2004 | Jablonski et al. | |
| 6,825,456 B2 | 11/2004 | Chadwick et al. | |
| 6,897,777 B2 | 5/2005 | Holmes et al. | |
| 6,927,579 B2 | 8/2005 | Blades | |
| 6,985,771 B2 | 1/2006 | Fischell et al. | |
| 6,987,393 B2 * | 1/2006 | Jean | G01N 22/00 324/644 |
| 7,057,743 B2 * | 6/2006 | Merkel | G01N 22/04 250/223 R |
| 7,130,624 B1 | 10/2006 | Jackson et al. | |
| 7,138,936 B2 | 11/2006 | Duff et al. | |
| 7,188,037 B2 | 3/2007 | Hidehira | |
| 7,391,356 B2 | 6/2008 | Brumley et al. | |
| 7,459,916 B2 * | 12/2008 | Crain | G01R 31/001 324/240 |
| 7,512,511 B1 | 3/2009 | Schultz et al. | |
| 7,515,094 B2 | 4/2009 | Keller, III | |
| 7,609,199 B2 | 10/2009 | Nishijima et al. | |
| 7,639,178 B1 | 12/2009 | Mulbrook et al. | |
| 7,675,294 B2 * | 3/2010 | Stone, III | G01N 22/00 324/627 |
| 7,777,671 B2 | 8/2010 | Schnitzer et al. | |
| 7,777,672 B2 | 8/2010 | Schnitzer et al. | |
| 7,791,355 B1 * | 9/2010 | Esher | G01N 22/00 324/637 |
| 7,844,341 B2 | 11/2010 | Von Arx et al. | |
| 7,911,211 B2 * | 3/2011 | Crain | G01R 29/0835 324/240 |
| 8,063,813 B1 | 11/2011 | Keller | |
| 8,174,258 B2 * | 5/2012 | Raykhman | G01B 7/023 324/228 |
| 8,351,220 B2 * | 1/2013 | Liang | H01B 1/04 361/816 |
| 2002/0075189 A1 * | 6/2002 | Carillo, Jr. | H01Q 1/245 343/702 |
| 2003/0024315 A1 * | 2/2003 | Merkel | G01N 22/04 73/596 |
| 2007/0241761 A1 * | 10/2007 | Stone | G01N 22/00 324/627 |
| 2007/0279071 A1 | 12/2007 | Orton | |
| 2008/0103555 A1 | 5/2008 | Dicks et al. | |
| 2009/0281764 A1 * | 11/2009 | Raykhman | G01B 7/023 702/150 |
| 2010/0123453 A1 | 5/2010 | Pauly et al. | |
| 2010/0125438 A1 | 5/2010 | Audet | |
| 2011/0095934 A1 | 4/2011 | Freeman | |
| 2011/0320170 A1 | 12/2011 | Pathak et al. | |
| 2012/0179812 A1 | 7/2012 | Keller, III | |
| 2012/0223403 A1 * | 9/2012 | Keller, III | H01L 23/576 257/428 |
| 2012/0226463 A1 | 9/2012 | Keller, III et al. | |
| 2013/0229310 A1 | 9/2013 | Parks | |
| 2015/0137830 A1 * | 5/2015 | Keller, III | H01L 23/00 324/629 |
| 2015/0355109 A1 * | 12/2015 | Bayram | G01N 22/00 324/602 |
| 2015/0358337 A1 * | 12/2015 | Keller | H04W 12/12 726/23 |

OTHER PUBLICATIONS

Bonsen et al., IEEE Standard Method for Measuring the Effectiveness of Electromagnetic Shielding Enclosures, IEEE Std 299-1997, Dec. 9, 1997.*
ASTM International, Standard Test Method for Measuring the Electromagnetic Shielding Effectiveness of Planar Materials, designation D4935, 2010.*
Audone et al., Multiple Linear Regression to Detect Shielding Effectiveness Degradations, IEEE 2008.*
Svetanoff, On the Benefits of Using IEEE Std 299-1997 for shielding effectiveness testing, Lindgren RF enclosures, inc., IEEE 1999.*
Hock et al., Automated Shielding Effectiveness Test System for Shielded Enclosures, International Symposium on Electromagnetic Compatibility, 1999, IEEE.*
Kinningham et al., Test Methods for Electromagnetic Shielding Materials, 3M/Static & Electromagnetic Control Division, 1988, IEEE.*
Perumalraj et al., Electromagnetic Shielding Tester for Conductive Textile Materials, Indian Journal of Fibre & Textile Research, vol. 35, Dec. 2010 (Password Encrypted Cannot attached full text).*
Stephen Dorn Freeman, et al. Active Improvised Explosive Device (IED) Electronic Signature Detection, Filed Apr. 13, 2009, U.S. Appl. No. 12/422,646.

* cited by examiner

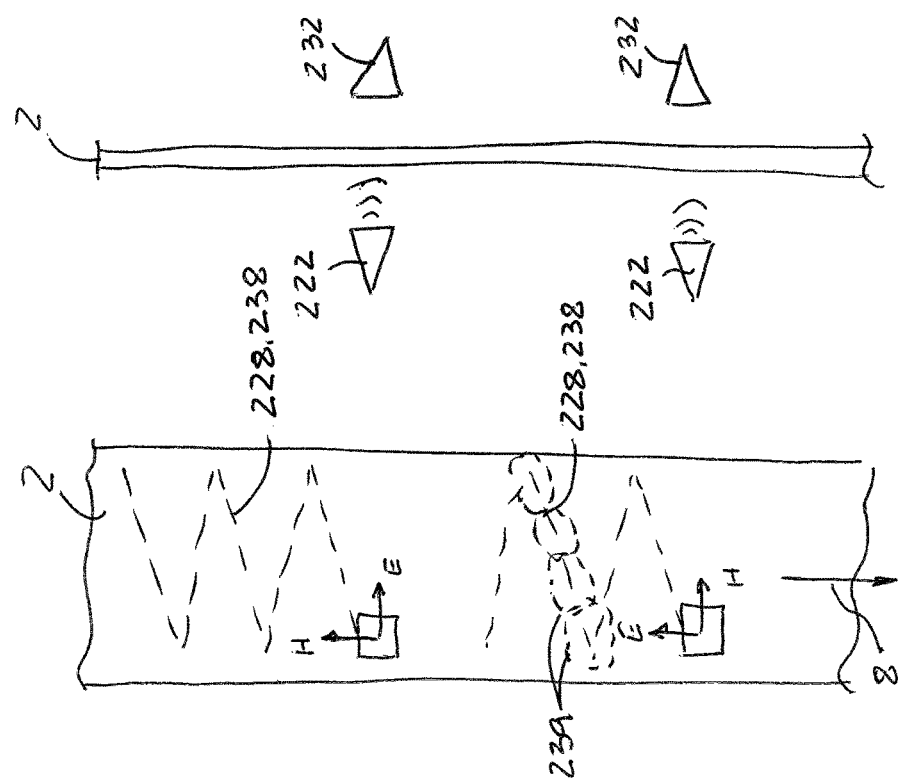

AUTOMATED SENSOR SYSTEM FOR RF SHIELDING CHARACTERIZATION

CROSS-REFERENCE TO RELATED APPLICATIONS

This application is related to and claims priority from U.S. Provisional Patent Application Ser. No. 61/851,325 filed on Mar. 6, 2013.

FIELD OF THE INVENTION

The present invention relates, in general, to testing of electromagnetic interference shielding materials and, more particularly, this invention relates to a system and method for determining, in a non-destructive manner, structural characteristics and/or properties of an electromagnetic energy shielding material, particularly during a manufacturing process thereof.

STATEMENT REGARDING FEDERALLY SPONSORED RESEARCH AND DEVELOPMENT

N/A

REFERENCE TO SEQUENCE LISTING, A TABLE, OR A COMPUTER PROGRAM LISTING COMPACT DISC APPENDIX

N/A

BACKGROUND OF THE INVENTION

As is generally well known, gaskets, sheets, or mats of Electromagnetic Interference (EMI) protective materials have critical value for many systems of strategic importance for the civilian and military applications. Aerospace systems, in particular, can be compromised and even permanently disabled by EMI effects if not shielded appropriately. It is of great importance that all such materials that are integrated into fielded systems are fully capable of meeting shielding requirements.

Electronic systems and, in particular sensor systems, while critical for the operation of a multitude of weapon systems tend to be very vulnerable to Electro-Magnetic Interference (EMI), Electro-Static Discharge (ESD), and lightning. To protect these systems, shielding materials meeting stringent specifications in the areas of EMI, ESD, and lightning are regularly employed. Such materials commonly constructed from woven or non-woven fibers that are further pre-impregnated with epoxy resin to provide a broad spectrum of environmental shielding.

The pre-impregnation (prepreg) process subjects the carbon fibers to significant stresses: thermal, mechanical, etc. It is well established that at this stage, deformations and changes often occur, preventing the fibers from meeting shielding requirements. It is therefore necessary to identify such defective material before it is integrated into a system and deployed to the field.

However, direct measurement of material performance as traditionally performed and detection of defects or flaws, for example by procedure in accordance with ASTM D4935-10 standard, is not only time consuming but requires a high level of engineering expertise and involvement, resulting in significant added cost to the process and thereby to the validated material itself, particularly when testing shielding material as it being produced on a manufacturing line in a continuous roll form.

A standard radio frequency (RF) specification for such shielding materials generally covers the 2-18 gigahertz (GHz) range. a suitable system to confirm effective shielding and detect defective material must be functional throughout this range. In addition, anisotropy of electromagnetic response is a common trait among these materials, and as a result the polarization of the RF source is very significant.

Therefore, there is a need for an improved system and method for determining, in a non-destructive manner, structural and/or electromagnetic characteristics and/or properties of an electromagnetic energy (EME) shielding material during a manufacturing process thereof.

SUMMARY OF THE INVENTION

The invention provides a system for determining, in a non-destructive manner, structural and/or electromagnetic characteristics of an electromagnetic energy shielding material during a manufacturing process thereof, the electromagnetic energy shielding material having a pair of spaced apart surface defining a thickness thereof. The system includes a transmitting antenna device mounted at a distance from one of the pair of surfaces of the electromagnetic energy shielding material for a reciprocal linear movement across a width of the electromagnetic energy shielding material. The transmitting antenna device is connected to a source of the electromagnetic energy and operable to transmit waves of the EE through the thickness of the electromagnetic energy shielding material during the reciprocal linear movement. There is also a receiving antenna device mounted at a distance from an opposite one of the pair of surfaces of the electromagnetic energy shielding material for the reciprocal linear movement across the width of the electromagnetic energy shielding material. The receiving antenna device is aligned in a plane transverse to the pair of surfaces with the transmitting antenna device and operable to receive, during the reciprocal linear movement, the waves of electromagnetic energy being absorbed and attenuated by the electromagnetic energy shielding material. A means is provided for moving the transmitting and the receiving antenna devices while the EE shielding material is moving in a linear direction being transverse to the reciprocal linear movement.

The invention also provides a method for determining, in a non-destructive manner, structural characteristics of an electromagnetic energy shielding material during a manufacturing process thereof. The method includes the step of providing the electromagnetic energy shielding material. Next, positioning a transmitting antenna device at a distance from one surface of the electromagnetic energy shielding material. Then, positioning a receiving antenna device at a distance from an opposite surface of the electromagnetic energy shielding material and in an operative alignment with the transmitting antenna. Moving the electromagnetic energy shielding material in a linear direction. Then, reciprocally moving the transmitting and receiving antenna devices in a direction normal to the linear direction during movement of the electromagnetic energy shielding material. Next, transmitting, with the transmitting antenna, waves of electromagnetic energy through a thickness of the electromagnetic energy shielding material. Receiving, with the receiving antenna, the waves of electromagnetic energy being attenuated by the thickness. Finally, processing, with a processing apparatus coupled to the receiving antenna device, signatures of the attenuated waves.

OBJECTS OF THE INVENTION

It is, therefore, one of the objects of the present invention to provide a system for determining, in a non-destructive manner, structural and/or electromagnetic characteristics and/or properties of an electromagnetic energy shielding material during a manufacturing process thereof.

Another object of the present invention is to provide a system for determining, in a non-destructive manner, structural and/or electromagnetic characteristics and/or properties of an electromagnetic energy shielding material during a manufacturing process thereof that includes a dual polarity antennas translating along a width of moving shielding material.

Yet another object of the present invention is to provide a system for determining, in a non-destructive manner, structural and/or electromagnetic characteristics and/or properties of an electromagnetic energy shielding material during a manufacturing process thereof that includes a pair of transmitting antennas and a pair of receiving antennas with reversed polarities that translate along a width of moving shielding material.

A further object of the present invention is to provide a system for determining, in a non-destructive manner, structural and/or electromagnetic characteristics and/or properties of an electromagnetic energy shielding material during a manufacturing process thereof compares power that measures and processes the power of transmitted electromagnetic energy after attenuation by the shielding material.

Yet a further object of the present invention is to provide a system for determining, in a non-destructive manner, structural and/or electromagnetic characteristics and/or properties of an electromagnetic energy shielding material during a manufacturing process thereof in the radio and microwave frequency range.

An additional object of the present invention is to provide a system for determining, in a non-destructive manner, structural and/or electromagnetic characteristics and/or properties of an electromagnetic energy shielding material during a manufacturing process thereof that records and/or maps locations of any and all regions of sub-specification performance.

Another object of the present invention is to provide a system for determining, in a non-destructive manner, structural and/or electromagnetic characteristics and/or properties of an electromagnetic energy shielding material during a manufacturing process thereof that operates at a speed suitable for matching the speeds that roll-to-roll prepreg processes currently are operating at.

A further object of the present invention is to provide a system for determining, in a non-destructive manner, structural and/or electromagnetic characteristics and/or properties of an electromagnetic energy shielding material during a manufacturing process thereof that is cost efficient to implement.

A further object of the present invention is to provide a system for determining, in a non-destructive manner, structural characteristics and/or properties of a pre-impregnated carbon fiber material during a manufacturing process.

Another object of the present invention is to provide a system for determining, in a non-destructive manner, structural characteristics and/or properties of carbon fiber material during a manufacturing process.

A further object of the present invention is to provide a system for determining, in a non-destructive manner, structural or compositional characteristics, mechanical properties and chemical properties of a pre-impregnated non-carbon fiber or carbon fiber material during a manufacturing process.

Another object of the present invention is to provide a system for determining, in a non-destructive manner, structural characteristics and/or properties of a mat material during a manufacturing process.

Another object of the present invention is to provide a system for determining, in a non-destructive manner, structural characteristics and/or properties of a thin film material during a manufacturing process.

Another object of the present invention is to provide a system for determining, in a non-destructive manner, structural characteristics and/or properties of a dry mat material during a manufacturing process.

In addition to the several objects and advantages of the present invention which have been described with some degree of specificity above, various other objects and advantages of the invention will become more readily apparent to those persons who are skilled in the relevant art, particularly, when such description is taken in conjunction with the attached drawing Figures and with the appended claims.

BRIEF DESCRIPTION OF THE DRAWINGS

FIGS. 2A-B is a diagrammatic view of the system of FIG. 1, constructed in accordance with another form of the invention.

BRIEF DESCRIPTION OF THE VARIOUS EMBODIMENTS OF THE INVENTION

Figure 1:
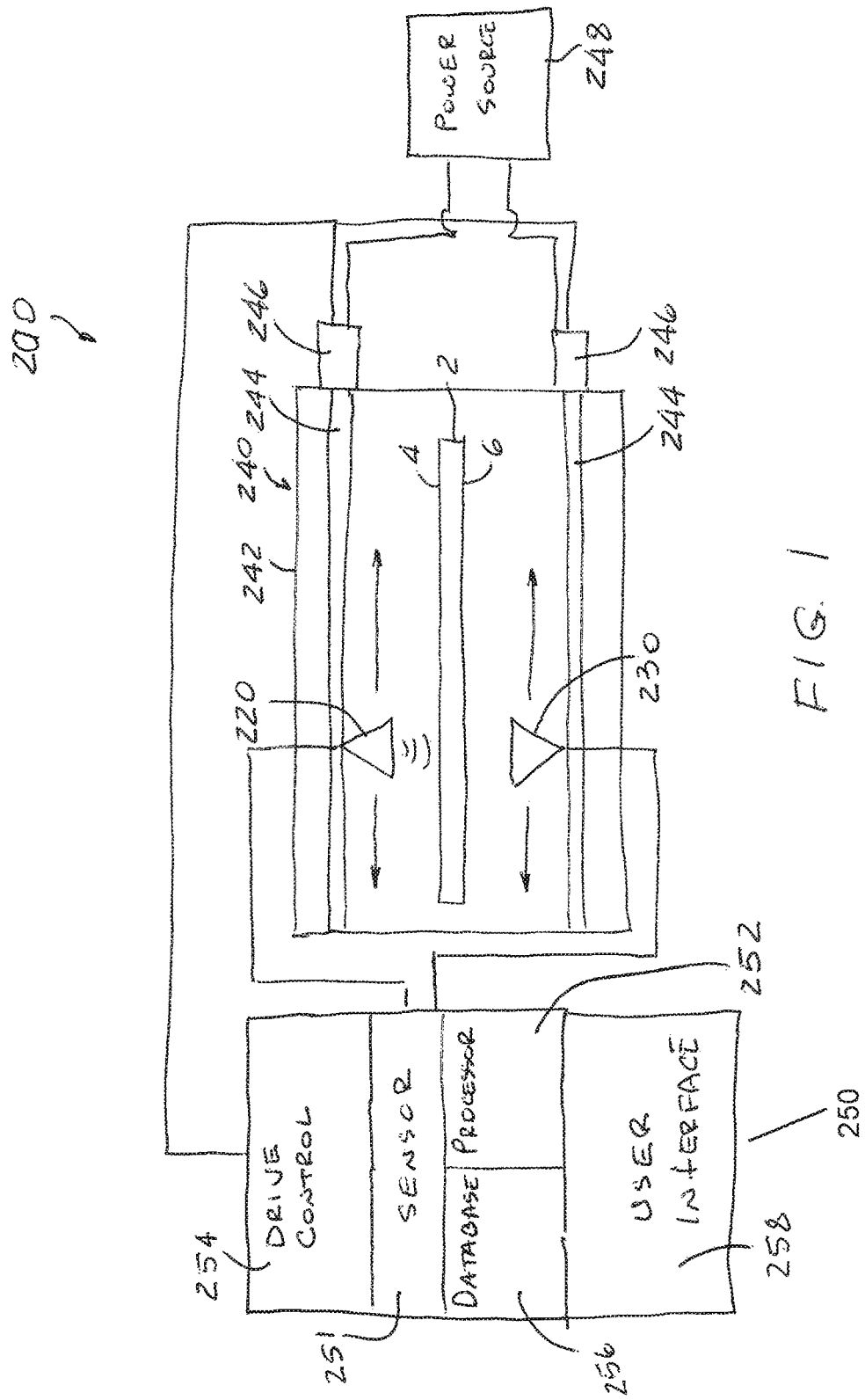
FIG. 1 is a diagrammatic view of a system for determining, in a non-destructive manner, structural characteristics and/or properties of an electromagnetic energy shielding material, preferably during a manufacturing process thereof.
Figure 3C:
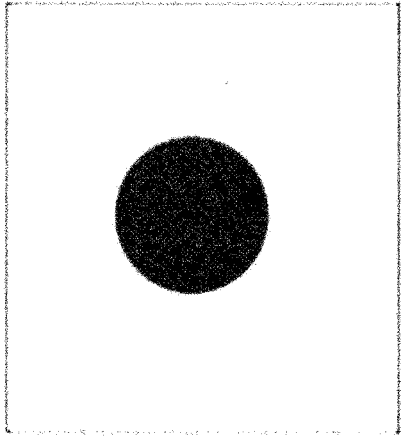
FIGS. 3A-F illustrate defect arrays cut into the shielding material to simulate and/or resemble manufacturing flaws.
Figure 3F:
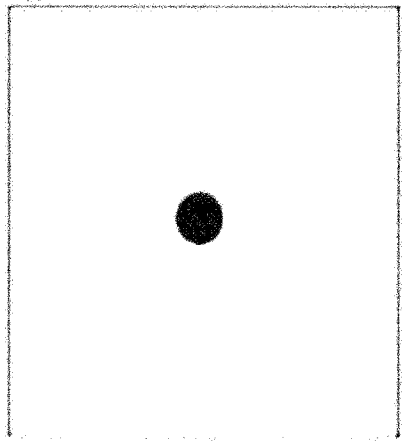
Figure 3B:
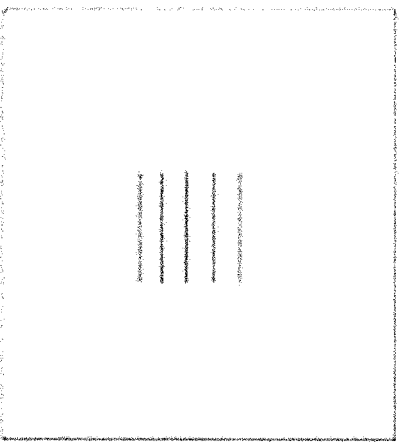
Figure 3E:
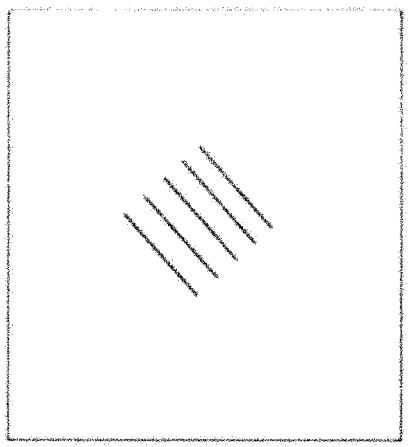
Figure 3A:
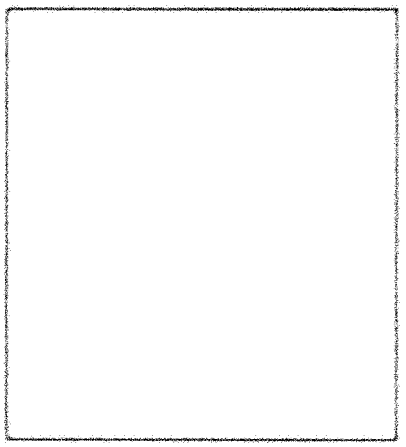
Figure 3D:

Prior to proceeding to the more detailed description of the present invention, it should be noted that, for the sake of clarity and understanding, identical components which have identical functions have been identified with identical reference numerals throughout the several views illustrated in the drawing figures.

The present invention describes a system and method for determining, in a non-destructive manner, structural and electromagnetic characteristics of an electromagnetic energy shielding material 2, preferably during a manufacturing process thereof. The electromagnetic energy shielding material has a pair of spaced apart surfaces 4 and 6 defining a thickness thereof.

It will be obvious to those skilled in the art that the present invention further provides a means to assess the compositional, mechanical, chemical, structural, homogeneity and surface properties of mat materials, carbon fiber materials, dry mat materials, ceramics, fiberglass composites, reinforced plastics, coatings and thin films.

The electromagnetic energy shielding material 2 is generally manufactured from woven or non-woven carbon fibers. The instant invention is particularly concerned with such woven or non-woven carbon fibers being pre-impregnated with a resin, for example of an epoxy type, thus defining a multi-layer material 2. Furthermore, the instant invention is concerned with such woven or non-woven carbon fibers coated with an alloy of at least one of nickel, copper and silver.

The present invention is illustrated and described in combination with the electromagnetic energy shielding material 2 of a continuous roll type, although it will be apparent to those skilled in the relevant art that the present invention may be applied to other forms of the electromagnetic energy shielding material 2, for example of a mat or gasket types, and as such should not be interpreted as a limiting factor of the present invention.

Reference is now made, to FIG. 1, wherein there is shown a system, generally designated as 200, for determining, in a non-destructive manner, structural and/or electromagnetic characteristics of an electromagnetic energy shielding material 2, preferably during a manufacturing process thereof, for example such as a continuous feed manufacturing equipment configured to manufacture electromagnetic energy shielding material 2 in a sheet roll form. More specifically, the electromagnetic energy shielding material 2 has undergone pre-impregnation step, that has been described above, which subjects the carbon fibers to significant stresses. However, the instant invention also contemplates that the system 200 can be used on electromagnetic energy shielding material 2 of a mat or a gasket type.

Now in a further reference to FIG. 1, the system 200 comprises a transmitting antenna device 220 mounted at a distance from one of the pair of surfaces of the electromagnetic energy shielding material 2, referenced with a numeral 4, for a reciprocal linear movement (rastering or translation) across a width of the electromagnetic energy shielding material 2. The transmitting antenna device 220 is connected to a source (Not Shown) of the electromagnetic energy and operable to transmit waves of the electromagnetic energy through the thickness of the electromagnetic energy shielding material 2.

System 200 also includes a receiving antenna device 230 mounted at a distance from an opposite one of the pair of surfaces of the electromagnetic energy shielding material 2, referenced with the numeral 6, for the reciprocal linear movement across the width of the electromagnetic energy shielding material 2. The receiving antenna device 230 is aligned in a plane transverse to the pair of surfaces 4, 6 with the transmitting antenna device 220 and is operable to capture or receive, during the reciprocal linear movement, the waves of electromagnetic energy being absorbed and attenuated by the electromagnetic energy shielding material 2.

The system 200 additionally includes a means, generally designated as 240, for moving the transmitting and the receiving antenna devices, 220 and 230 respectively, while the electromagnetic energy shielding material 2 is moving in a linear direction 8 being transverse to a direction of such reciprocal linear movement. In one exemplary embodiment of FIG. 2, such means 240 includes a support member 242, for example such as a frame or a gantry, a pair of linear actuators 244 and a pair of power drives 246, for example such as an electric motors, connected to a source of power 248 and operable to actuate the linear actuators 244 and move the transmitting and the receiving antenna devices, 220 and 230 respectively.

It is presently preferred for the system 200 to include a sensor and control assembly 250, coupled to at least the receiving antenna device 230 and, preferably also to the transmitting antenna 220, and operable to process one or more parameters of the attenuated waves of electromagnetic energy and determine the structural characteristics of the electromagnetic energy shielding material 2. The control assembly 250 includes a sensor 251, configured to convert received emissions from a time domain to a frequency domain and a processor 252 configured to perform a quantitative analysis on converted emissions in a frequency domain. Essentially, at each incremental scan, the processor 252 evaluates power levels of the attenuated electromagnetic energy received at the receiving antenna device 230 and compares such energy level against a threshold, any other known and preselected data and/or performance specifications that reside within the database 256. It would be understood, that areas of the electromagnetic energy shielding material 2 with internal or surface defects will result in greater power levels than areas free of any defects. The logic executed by the processor 252 is configured to identify overlapping regions from each incremental scan so as to properly map the entire area of the electromagnetic energy shielding material 2. The instant invention also contemplates that the system 200 may be configured, by way of a motor driving circuit 254, to control the reciprocal linear movement of the transmitting and receiving antennas, 220 and 230 respectively.

In order to leverage measured defect response behavior, logic executed by the processor 252 includes algorithms that support differentiatiation between effective and defective shielding material. Optimization constants associated with the selected algorithms are optimized for a selected application, and finally detection sensitivity is calibrated to trigger off RF responses that correlate to sub-specification material.

Depending on the application, algorithms perform data transformation, measurement point localization, defect detection, defect classification, correction factor application, material property extraction. Algorithms that could be utilized for this purpose include, but are not limited to, Fast Fourier Transform (FFT), Short-Time Fourier Transform (STFT), Discrete Fourier Transform, Delauney triangulation, Bayesian inference, linear extrapolation, Artificial Neural Networks (ANN), and non-linear curve fitting.

The present invention utilizes a free-space characterization setup consisting of multiple inwardly facing directional broadband microwave antenna devices mounted on opposite sides of the material to be characterized utilizing one or more simultaneous continuous and/or dynamic transmitted RF signals backed by a microwave receiver element and signal analysis hardware/software to characterize materials of interest. The software within the processor 252 leverages existing algorithms to report detection of faulty electromagnetic energy shielding material 2, and is optimized and calibrated for each specific electromagnetic energy shielding material 2 and set of specifications.

The assembly 250 also includes a user interface 258, preferably having graphic capabilities, to control operation of the antenna devices 220 and 230. In one non-limiting example, a simple 'stoplight' output is utilized to report results to the user initially, with 'green' indicating that the electromagnetic energy shielding material 2 currently passing through the antenna devices 220 and 230 complies with the specification and suitable for use, and a red output indicating that the electromagnetic energy shielding material 2 under inspection contains either internal or surface defects and does not meet required specification.

Thus, a method for determining, in a non-destructive manner, structural characteristics of a radio frequency (EE) shielding material 2 during a manufacturing process thereof comprises the step of providing the electromagnetic energy shielding material 2. Then, positioning a transmitting antenna device 220 at a distance from one surface of the electromagnetic energy shielding material 2 and positioning a receiving antenna device 230 at a distance from an opposite surface of the electromagnetic energy shielding material 2 and in an operative alignment with the transmitting antenna 220. Next, moving the electromagnetic energy shielding material 2 in a linear direction 8. Reciprocally moving the transmitting and receiving antenna devices, 220 and 230 respectively, in a direction normal to the linear direction 8 during movement of the electromagnetic energy shielding material 2. Then, transmitting, with the transmitting antenna 220, waves of electromagnetic energy through a thickness of the electromagnetic energy shielding material 2. Next, receiving, with the receiving antenna 230, the waves of electromagnetic energy being attenuated by the thickness of the material 2. Finally, processing, with the control assembly 250, coupled to the transmitting and receiving antenna devices, 220 and 230, signatures of the attenuated waves.

The processing step includes the step of determining surface and/or internal defects in the electromagnetic energy shielding material. The processing step also includes the step of estimating a performance of the electromagnetic energy shielding material. Measurements are performed in a range between 100 megahertz (MHz) to 20 gigahertz (GHz).

In accordance with one form of the invention each of the transmitting and receiving antenna devices, 220 and 230 respectively, is a dual polarization antenna transmitting the waves of electromagnetic energy in two directions disposed orthogonally to each other. As a non-limiting example, each of the transmitting and receiving antenna devices, 220 and 230 respectively, may be a dual horn antenna type available under Part Number PWBH2-18#HG from Q-par Angus Ltd. of United Kingdom, although the instant invention contemplates use of any dual polarization antenna operable in a range between 100 megahertz (MHz) to 20 gigahertz (GHz).

In another form of the invention of FIGS. 2A-B, each of the transmitting and receiving antenna devices, 220 and 230 respectively, includes a pair of antennas 222, 232 spaced apart with each other along a linear movement direction 8 of the electromagnetic energy shielding material 2. Each of the pair of antennas 222 is operable to transmit the waves of electromagnetic energy in an orthogonally distinct direction. More specifically, each of the pair of antennas 222, 232 is linearly polarized.

Marked by dashed lines 228 and 238 in FIG. 2A are the movement paths between antenna pairs produced by the combination of constant flow of the electromagnetic energy shielding material 2 in a direction 8 and translational movement of the antenna pairs 222, 232. Of a critical interest for the effectiveness of this implementation is a local region 239 sufficiently examined by a scan (i.e., the radius around any point on the dashed line out to which a defect would be expected to be detected). As an example, assuming a 6" functional radius, a mat or sheet 36" in width, and a flow rate of 13 feet per minute, the antenna pair 222, 232 must raster to the opposite side and back in about 5 seconds in order to validate 100% of material; with only a 3" radius this rate must be close to 2 seconds. This results in rapidly growing requirements for the means 240 and for scan speed (one complete scan must be performed for about every 1-2 detection radii of raster movement); at 6", about 15 scans must be completed each ~5 second cycle, where at 3", about 30 scans must be completed each ~2 second cycle.

The electromagnetic energy shielding material 2 of similar type and specifications may be utilized for verification of the results obtained by the system 200 for a specific application. All as-received material should be within specification; for the purposes of the effort, a significant amount of defective material must be examined and used for testing purposes.

To obtain a database of flawed/defective material, test material coupons can be prepared with artificial defects, arrays of cuts and holes with specified sizes, lengths, quantities, and arrangements, as in FIG. 3 above. It is of particular interest that defect arrays of an anisotropic type (see for example FIGS. 3B vs. 3D) are represented by samples using different orientations in order to fully test and understand the effectiveness of both polarizations employed by the system 10. Isotropic patterns (FIG. 3A) result in non-polar defects, anisotropic patterns (FIG. 3B, 3D) will result in defects that are polarized, but will be visible to characterization in one or both the horizontal or vertical polarizations directions. In general, slits and arrays of slits will be expected to be polar defects.

Finally, as it is also critical that defective regions at any location from edge to edge of the electromagnetic energy shielding material 2 are identified, material samples should be prepared with defects with varying relative locations (e.g., one sample with a defect near the edge, another with a defect 10 cm from the edge, another with a defect 20 cm from the edge, etc.).

Collection of a body of measurement data associating material defects with associated RF response deviations is considered valuable for optimal system calibration. Material prepared as above can be characterized in the system 200. At this stage, measured results are expected to be closely akin to raw reflections that would then be S-parameter data, covering the 2-18 GHz band and with separate data associated with both polarizations from the antenna device array.

The instant invention considers three relevant factors when collecting phenomenology during this task: 1) source broadband RF signal covering 2-18 GHz, 2) relative geometry of the defects, receiving antennas, and the relevant characteristics that impact the measurement of received signals, 3) storage of received signal information.

In a first aspect, for the source broadband RF signal covering 2-18 GHz, the stimulating signal type must be selected and it, along with its corresponding received signal, recorded. Standard stimulating signals are broadband Gaussian pulses and chirps, and these must be used to begin the search for signals customized to the shielding material under test. These signals illuminate where the shielding is strongest as well as most transmissive (least effective). This, in turn allows for fine tuning of the stimulating signals to ensure an effective baseline by exploiting the wide dynamic range of the system without either saturating the receiver or driving the received signal into the noise floor within specific frequency bands.

In a second aspect, the relative geometry of the defects (or lack thereof), source, and the receiving antenna device 30 must be considered, along with the signal and antenna polarization; anisotropic defect geometries are preferentially characterized along a particular polarization. While the intuitive expectation is that having the source transmitter, defects, and receiving antenna device 30 directly in-line would be the best situation, in practice additional information is often gained by having a defect oblique to the transmission/receiver line of sight because of the phase error that is introduced by what can be considered multipath.

In a third aspect, appropriate storage of the collected data is critical to its utilization. The database 256 allows for automated search across the frequency spectrum for areas with signal content along with comparison of algorithms by coupling directly with MATLAB and C++. This database 256 and analysis system are critical for functionality. Customizations can be accomplished and can be begun in tandem with sample preparation such that the database is ready when collection of phenomenology begins.

Application-specific optimizations of this technology require steps involving both selection of the most appropriate algorithms for a specific application and then tailoring or customization of those algorithms to best capture the types of RF variations that are observed to be meaningful. Finally, scoring from the algorithms should be calibrated so that detection is neither oversensitive (in particular False Alarms) or insufficiently discriminating (system should have a very high Probability of Detect for defective regions).

The calibrated algorithms can be 'tested' against the existing response database. Given that the system performs "proper detection" against the data set, it should be set to examine samples of material in the test bed. At each stage, the system should be modified and enhanced for optimal performance, with observed detection errors examined to determine cause and corrected through appropriate weighting steps.

Accuracy of defect detection is measured using a well-characterized section of the electromagnetic energy shielding material 2 that has not previously been analyzed. In the geometry originally described in FIG. 1, this section of material would be pulled through the antenna array at the standard feed rate and outputs.

Thus, the present invention has been described in such full, clear, concise and exact terms as to enable any person skilled in the art to which it pertains to make and use the same. It will be understood that variations, modifications, equivalents and substitutions for components of the specifically described embodiments of the invention may be made by those skilled in the art without departing from the spirit and scope of the invention as set forth in the appended claims.

We claim:

1. A system for determining, in a non-destructive manner, structural characteristics of an electromagnetic energy shielding material during a manufacturing process thereof, the electromagnetic energy shielding material having a pair of spaced apart surfaces defining a thickness thereof, said system comprising:
   (a) a transmitting antenna device mounted at a distance from one of the pair of surfaces of the electromagnetic energy shielding material for a reciprocal linear movement across a width of the electromagnetic energy shielding material, said transmitting antenna device being connected to a source of the electromagnetic energy and operable to transmit waves of the electromagnetic energy through the thickness of the electromagnetic energy shielding material during said reciprocal linear movement;
   (b) a receiving antenna device mounted at a distance from an opposite one of the pair of surfaces of the electromagnetic energy shielding material for said reciprocal linear movement across the width of the electromagnetic energy shielding material, said receiving antenna device being aligned in a plane transverse to the pair of surfaces with said transmitting antenna device and operable to receive, during said reciprocal linear movement, said waves of electromagnetic energy being absorbed and attenuated by the electromagnetic energy shielding material;
   (c) a sensor and control assembly coupled to at least said receiving antenna device and operable to process one or more parameters of said attenuated waves of said electromagnetic energy and determine the structural characteristics of the electromagnetic energy shielding material; and
   (d) a means for moving said transmitting and said receiving antenna devices in said reciprocal linear movement.

2. The system, according to claim 1, wherein said sensor and control assembly includes a processor configured to perform a quantitative analysis on scattering parameter data.

3. The system, according to claim 1, wherein said sensor and control assembly includes a processor configured to perform analysis on a frequency or time domain data.

4. The system, according to claim 1, wherein said sensor and control assembly is further configured to control said reciprocal linear movement of said transmitting and receiving antennas.

5. The system, according to claim 1, wherein each of said transmitting and receiving antenna devices is a dual polarization antenna transmitting said waves of electromagnetic energy in two directions disposed orthogonally to each other.

6. The system, according to claim 1, wherein each of said transmitting and receiving antenna devices includes a pair of antennas spaced apart with each other along a linear movement direction of the electromagnetic energy shielding material.

7. The system, according to claim 6, wherein each of said pair of antennas is operable to transmit said waves of electromagnetic energy in an orthogonally distinct direction.

8. The system, according to claim 6, wherein each of said pair of antennas is linearly polarized.

9. The system, according to claim 1, wherein said means for moving said transmitting and said receiving antenna devices includes a pair of linear actuators.

10. The system according to claim 1, wherein said system is configured to non-destructively evaluate at least one of pre-impregnated carbon fiber or pre-impregnated non-carbon fiber to assess the structural characteristics of the electromagnetic energy shielding material.

11. The system according to claim 1, wherein said system is configured to non-destructively evaluate at least one of structural, compositional, mechanical and chemical properties of the electromagnetic energy shielding material being at least one of carbon fiber, non-carbon fiber, mat material, dry mat material, thin film material.

12. A method for determining, in a non-destructive manner, structural characteristics of an electromagnetic energy shielding material movable in a linear direction during a manufacturing process thereof, said method comprising the steps of:
   (a) providing said electromagnetic energy shielding material;
   (b) positioning a transmitting antenna device at a distance from one surface of said electromagnetic energy shielding material;
   (c) positioning a receiving antenna device at a distance from an opposite surface of said electromagnetic energy shielding material and in an operative alignment with said transmitting antenna device;
   (d) reciprocally moving said transmitting and receiving antenna devices in a direction normal to said linear direction during movement of said electromagnetic energy shielding material;
   (e) transmitting, with said transmitting antenna device, waves of electromagnetic energy through a thickness of said electromagnetic energy shielding material;

(f) receiving, with said receiving antenna device, said waves of electromagnetic energy being attenuated by said thickness; and (g) processing, with a processor coupled to said receiving antenna device, signatures of said attenuated waves.

13. The method of claim 12, wherein the step (a) comprises the step of manufacturing said electromagnetic energy shielding material from woven or non-woven carbon fibers.

14. The method of claim 12, wherein the step (a) comprises the step of impregnating said woven or non-woven carbon fibers with an epoxy resin.

15. The method of claim 12, wherein the step (a) comprises the step of manufacturing said electromagnetic energy shielding material from carbon fibers and the step of coating said carbon fibers with at least one of nickel, copper and silver.

16. The method of claim 12, wherein the step (g) includes the step of determining surface and/or internal defects in said electromagnetic energy shielding material.

17. The method of claim 12, wherein the step (g) includes the step of estimating a performance of said electromagnetic energy shielding material.

18. The method of claim 12, wherein the step (g) includes the step of performing measurements in a range between 100 megahertz (MHz) to 20 gigahertz (GHz).

19. The method of claim 12, wherein said electromagnetic energy shielding material is at least one of carbon fiber or pre-impregnated non-carbon fiber and the measurements are used to assess the structural characteristics of the electromagnetic energy shielding material.

20. The method of claim 12, wherein said measurements are intended to assess at least one of structural, compositional, mechanical and chemical properties of the electromagnetic energy shielding material being at least one of carbon fiber, non-carbon fiber, mat material, dry mat material, thin film material.

21. A system for determining, in a non-destructive manner, structural characteristics of a material, the material having a pair of spaced apart surfaces defining a thickness thereof, said system comprising:

a support member;

two linear actuators mounted on said support member in a spaced apart relationship with each other;

two power drives, each power drive operable to actuate a respective linear actuator;

a transmitting antenna device mounted on one of said two linear actuators at a distance from one of the pair of surfaces of the material for a reciprocal linear movement across a width of the material, said transmitting antenna configured to transmit waves of the electromagnetic energy through the thickness of the material during said reciprocal linear movement;

a receiving antenna device mounted on another one of said two linear actuators at a distance from an opposite one of the pair of surfaces of the material for said reciprocal linear movement across the width of the material, said receiving antenna device being operable to receive, during said reciprocal linear movement, waves of electromagnetic energy transmitted from said transmitting antenna device and being attenuated by the material; and a sensor and control assembly coupled to at least said receiving antenna device and configured to process one or more parameters of said waves of said electromagnetic energy attenuated by the material and determine the structural characteristics of the material, said sensor and control assembly comprising:

a sensor coupled to at least said receiving antenna device and configured to receive said waves of said attenuated electromagnetic energy from said receiving antenna, a driving circuit configured to control said reciprocal linear movement of said transmitting and said receiving antenna devices, a user interface, a database, and a processor executing logic and being configured to evaluate power levels of said attenuated electromagnetic energy and compare said power levels of said attenuated electromagnetic energy against a threshold, a preselected data and/or performance specifications that reside within said database.

22. The system of claim 21, wherein said sensor is configured to convert received electromagnetic energy from a time domain to a frequency domain, said processor configured to evaluate said power levels in said frequency domain.

23. The system of claim 21, wherein said processor is configured to identify overlapping regions from each incremental scan during said reciprocal linear movement so as to map an entire area of the electromagnetic energy shielding material.

24. The system of claim 21, wherein the material is any one of mat materials, carbon fiber materials, dry mat materials, ceramics, fiberglass composites, reinforced plastics, coatings and thin films.

25. The system of claim 21, wherein the material is an electromagnetic shielding material comprising woven or non-woven carbon fibers.

26. The system of claim 25, wherein said electromagnetic shielding material further comprises a resin pre-impregnating said woven or non-woven carbon fibers.

* * * * *